United States Patent
Huang et al.

[11] Patent Number: 6,110,822
[45] Date of Patent: Aug. 29, 2000

[54] METHOD FOR FORMING A POLYSILICON-INTERCONNECT CONTACT IN A TFT-SRAM

[75] Inventors: Kuo-Ching Huang, Kaohsiung; Yean-Kuen Fang, Tainan; Mong-Song Liang, Hsin-Chu; Dun-Nian Yaung, Taipei, all of Taiwan

[73] Assignee: Taiwan Semiconductor Manufacturing Company, Hsin-Chu, Taiwan

[21] Appl. No.: 09/047,539

[22] Filed: Mar. 25, 1998

[51] Int. Cl.$^7$ .......................... H01L 21/44; H01L 21/00; H01L 21/84; H01L 21/3205; H01L 21/4763

[52] U.S. Cl. .......................... 438/657; 438/166; 438/586; 438/652; 438/674; 438/656; 438/677

[58] Field of Search .................... 438/166, 586, 438/652, 657, 674, 677

[56] References Cited

U.S. PATENT DOCUMENTS

| | | | |
|---|---|---|---|
| 4,398,335 | 8/1983 | Lehrer | 29/577 |
| 4,581,623 | 4/1986 | Wang | 357/23.7 |
| 4,619,038 | 10/1986 | Pintchovski | 29/590 |
| 4,800,177 | 1/1989 | Nakamae | 437/193 |
| 5,059,554 | 10/1991 | Spinner et al. | 437/193 |
| 5,336,916 | 8/1994 | Chan et al. | 257/377 |
| 5,605,853 | 2/1997 | Yoo et al. | 437/43 |
| 5,824,574 | 10/1998 | Yamazaki et al. | 438/150 |

*Primary Examiner*—Wael Fahmy
*Assistant Examiner*—Neal Berezny
*Attorney, Agent, or Firm*—George O. Saile; Stephen B. Ackerman; Graham S. Jones, II

[57] ABSTRACT

A method of forming a contact in a thin film transistor with a gate electrode and an interconnect formed on a substrate, in an SRAM device comprises the following steps. Form a gate oxide layer over device. Form a split amorphous silicon layer over gate oxide layer. Form a cap layer over split amorphous silicon layer. Form a contact opening down to interconnect. Form contact metallization in opening on the surface of interconnect either as a blanket titanium layer followed by rapid thermal anneal to form a silicide and stripping unreacted titanium or by selective formation of a tungsten metal silicide in the opening. Strip cap layer from device. Form a second amorphous silicon layer on split silicon layer. Recrystallize silicon layers to form a polysilicon channel layer from amorphous silicon layers. Dope regions of polysilicon channel layer aside from a channel region above gate electrode.

23 Claims, 9 Drawing Sheets

METHOD FOR FORMING A POLYSILICON-INTERCONNECT CONTACT IN A TFT-SRAM

BACKGROUND OF THE INVENTION

1. Field of the Invention

This invention relates to SRAM MOSFET devices and more particularly to contacts to interconnection lines therein.

2. Description of Related Art

U.S. Pat. No. 4,581,623 of Wang for "Interlayer Contact for Use in a Static RAM Cell" shows the formation of a silicide layer between a P-type and N-type polysilicon layer.

U.S. Pat. No. 5,336,916 of Chan et al. for "SRAM Cell and Structure with Polycrystalline P-Channel Load Devices" shows a method of forming an SRAM cell with polysilicon P-channel load devices. Chan et al. forms an interconnect layer 35 formed of N type polysilicon layer 36 and a barrier layer 37 (preferably a silicide) between an N and a P type polysilicon bottom gate electrode layer 40, but in a different area from that of the present invention. N type polysilicon layer 36 is formed above the S/D region 22.

See col. 3 of U.S. Pat. No. 5,605,853 of Yoo et al. for "Method of Making a Semiconductor Device Having 4-Transistor SRAM and Floating Gate Memory Cells" which shows a conventional method of forming a contact in an SRAM cell.

See also U.S. Pat. No. 4,398,335 of Lehrer for "Multilayer Metal Silicide Interconnections for Integrated Circuits" and U.S. Pat. No. 4,800,177 of Nakamae for "Semiconductor Device Having Multilayer Silicide Contact System and Process of Fabrication Thereof."

SUMMARY OF THE INVENTION

An object of this invention is to improve the Polysilicon/$SiO_2$ interface quality and the subthreshold swing.

Another object of this invention is to reduce the voltage drop across the contact due to the tungsten or titanium silicide formation and the elimination of the PN junction diode at the contact.

A further object of this invention is to increase the $I_{ON}/I_{OFF}$ ratio (Increase $I_{ON}$ and Reduce $I_{OFF}$.)

The invention shows the formation of a titanium silicide or tungsten metal layer between an N-type and a P-type polysilicon layer. This connection is formed on an SRAM interconnect line.

1. Split, amorphous silicon layers are used to avoid the covering of photoresist direct on the gate oxide.

2. Tungsten technology is used selectively to form a polysilicon-interconnect contact.

In accordance with this invention a method of forming a contact in a thin film transistor with a gate electrode and an interconnect formed on a substrate, in an SRAM device comprises the steps as follows:

form an interconnect and a gate electrode on the substrate, form a gate oxide layer covering the interconnect, the gate electrode and the substrate, form a first amorphous silicon layer over the gate oxide layer, form a cap layer over the amorphous silicon layer, form a contact opening through the cap layer, the first amorphous silicon layer and the gate oxide layer down to the top surface of the interconnect, form a contact metallization layer in the opening on the surface of the interconnect, remove the cap layer from the first amorphous silicon layer, form a second amorphous silicon layer on the first amorphous silicon layer, recrystallize the silicon layers to form a polysilicon channel layer from the first amorphous silicon layer and the second amorphous silicon layer, and dope regions of the polysilicon channel layer aside from a channel region above the gate electrode.

Preferably, before removing the cap layer from the first amorphous silicon layer, the contact metallization is formed selectively in the opening on the surface of the interconnect as a contact layer by reacting silane and tungsten hexafluoride to form tungsten on the top surface of the interconnect, then removing the cap layer from the device, and then after the recrystallizing step forming a channel mask to protect a channel region over the channel layer, and doping the channel layer in source/drain regions through openings in the channel mask.

Preferably, the first amorphous silicon layer comprises an LPCVD amorphous silicon from about 100 Å to about 600 Å thick, the cap layer comprises a CVD silicon oxide from about 300 Å to about 500 Å thick, before removing the cap layer from the first amorphous silicon layer, the contact metallization is formed selectively in the opening on the top surface of the interconnect as a contact layer preferably by reacting silane and tungsten hexafluoride to form tungsten on the surface of the interconnect, then removing the cap layer from the device, the second amorphous silicon layer comprises an LPCVD amorphous silicon from about 100 Å to about 600 Å thick, then performing the recrystallizing step at a temperature from about 550° C. to about 650° C. in an ambient atmosphere of nitrogen gas for from about 24 hours to about 120 hours, then after the recrystallizing step forming a channel mask to protect a channel region over the channel layer, and doping the channel layer in source/drain regions through openings in the channel mask.

Alternatively, the contact metallization layer of titanium is formed as a blanket contact layer over the device, followed by rapid thermal annealing, and then etching, with the metallization remaining in the opening.

Preferably, before removing the cap layer from the device forming a blanket layer of titanium contact metallization on the surface of the device and in the opening on the top surface of the interconnect as a contact layer, performing a rapid thermal anneal to form titanium silicide selectively on the surface of the interconnect by reaction with the contact layer and the first amorphous silicon layer while leaving the titanium intact away from the interconnect.

Preferably, before removing the cap layer from the first amorphous silicon layer, the contact metallization is formed on the cap layer and in the opening on the surface of the interconnect, performing a rapid thermal anneal to form titanium silicide selectively on the surface of the interconnect by reaction with the contact layer and the first amorphous silicon layer while leaving the titanium unreacted and intact away from the interconnect, then removing the unreacted titanium from the surface of the cap layer, then removing the cap layer from the device, and then forming the second amorphous silicon layer, then after performing the recrystallizing step forming a channel mask to protect a channel region over the channel layer, and doping the channel layer in source/drain regions through openings in the channel mask.

Preferably, before removing the cap layer from the first amorphous silicon layer, the contact metallization is formed as a blanket contact layer on the first amorphous silicon layer and in the opening on the surface of the interconnect as a contact layer by depositing a blanket layer of titanium on the cap layer and into the opening followed by rapid thermal annealing to form titanium silicide on the surface of the interconnect where the titanium is in contact with the first amorphous silicon layer while leaving the titanium unreacted and intact away from the interconnect, and then etching, with the unreacted titanium, then removing the cap layer from the device, and then after the recrystallizing step forming a channel mask to protect a channel region over the channel layer, and doping the channel layer in source/drain regions through openings in the channel mask.

Preferably, the rapid thermal annealing is performed at a temperature from about 750° C. to about 850° C. to form the metal silicide, and then etching away the metallization with the titanium silicide remaining in the opening.

In accordance with another aspect of the invention a method of forming a contact in a thin film transistor with a gate electrode and an interconnect formed on a substrate, in an SRAM device comprises:

form a gate oxide layer over the device, form a first amorphous amorphous silicon layer over the gate oxide layer, form a cap layer over the split amorphous silicon layer, form a contact opening down to the interconnect, form blanket contact metallization on the cap layer and reaching down into the opening and onto the surface of the interconnect, then performing a rapid thermal anneal to form a metal silicide layer selectively in the opening on the surface of the interconnect as a contact layer leaving the remainder of the contact metallization unreacted, etch away the remainder of the contact metallization above the amorphous silicon layer, removing the cap layer from the device, form a second amorphous silicon layer on the first amorphous silicon layer, recrystallize the silicon layers to form a polysilicon channel layer from the amorphous silicon layers, and dope regions of the polysilicon channel layer aside from a channel region above the gate electrode.

Preferably, the blanket layer of contact metallization comprises a layer of titanium.

Before removing the cap layer from the device forming a blanket layer of titanium contact metallization on the surface of the device and in the opening on the surface of the interconnect as a contact layer, and performing a rapid thermal anneal to form titanium silicide selectively on the surface of the interconnect by reaction with the contact layer and the first amorphous silicon layer while leaving the titanium intact away from the interconnect.

Preferably, the contact metallization comprises a titanium layer, performing the rapid thermal anneal to form titanium silicide selectively on the surface of the interconnect by reaction with the titanium layer and the first amorphous silicon layer while leaving the titanium unreacted and intact away from the interconnect, then the etch of the remainder of the contact metallization which comprises unreacted titanium from the surface of the cap layer, then removing the cap layer from the device by dry reactive ion etching, and then forming the second amorphous silicon layer, then performing the recrystallizing step then after performing the recrystallizing step forming a channel mask to protect a channel region over the channel layer, and doping the channel layer in source/drain regions through openings in the channel mask.

Preferably, the first amorphous silicon layer comprises an LPCVD amorphous silicon from about 100 Å to about 600 Å thick, the cap layer comprises a CVD silicon oxide from about 300 Å to about 500 Å thick, the second amorphous silicon layer comprises an LPCVD amorphous silicon from about 100 Å to about 600 Å thick, then performing the recrystallizing step at a temperature from about 550° C. to about 650° C. in an ambient atmosphere of nitrogen gas for from about 24 hours to about 120 hours, then after the recrystallizing step forming a channel mask to protect a channel region over the channel layer, and doping the channel layer in source/drain regions through openings in the channel mask.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Problem Solved by Invention

With the continued scaling of device structures to deep submicron level the operating voltage becomes lower. Thus, the voltage drop across a contact is no longer a negligible factor in device performance. Besides, $I_{ON}/I_{OFF}$ ratio and subthreshold swing of a TFT are also major concern in a TFT SRAM. However, the conventional process of forming a polysilicon-interconnect contact has two disadvantages:

First, the conventional process will degrade the polysilicon-Si/SiO$_2$ interface quality more or less and cause the larger off current ($I_{OFF}$), TFT subthreshold swing due to the covering of photoresist direct on the gate oxide.

Second, the conventional process will also degrade the ON state current ($I_{DSAT}$) of TFT because of the voltage drop across the contact result from the existence of PN junction diode.

First Preferred Embodiment

Figure 1A:
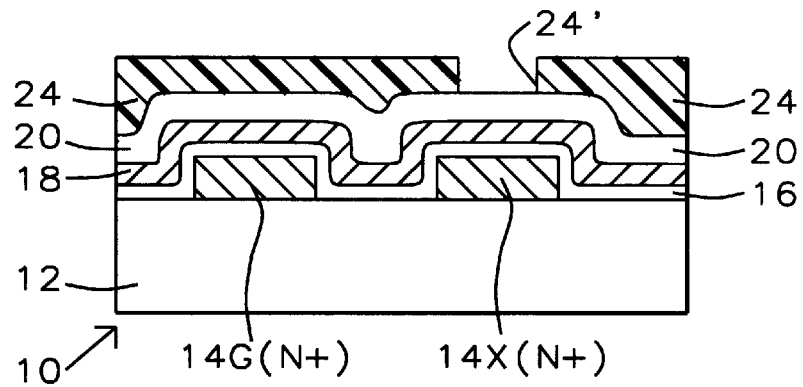
FIGS. 1A–1G which are cross sections of a device in accordance with this invention showing the process flow in the course of manufacture of the device.
Figure 1B:
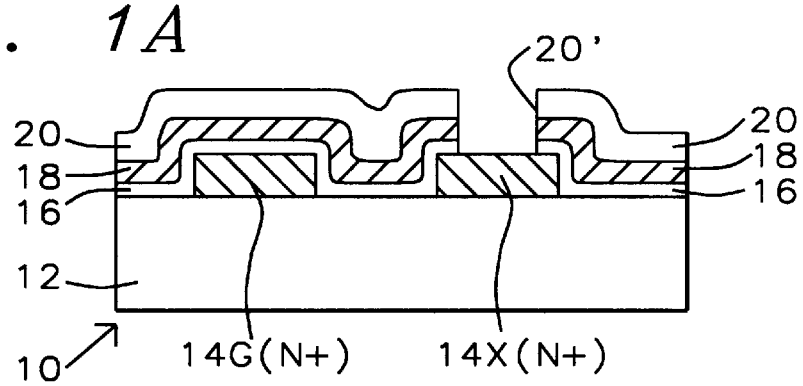
Figure 1C:
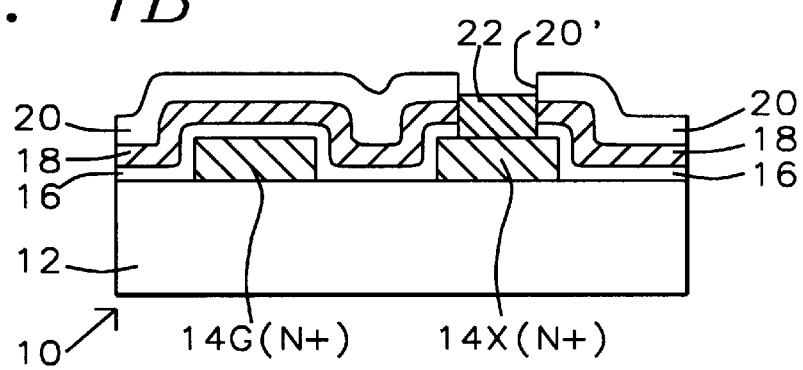
Figure 1D:
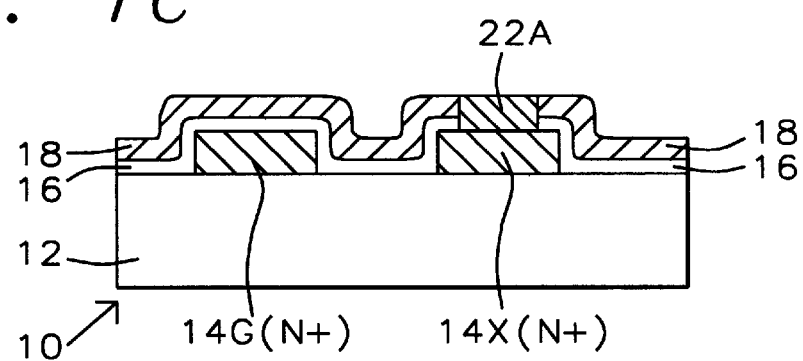
Figure 1E:
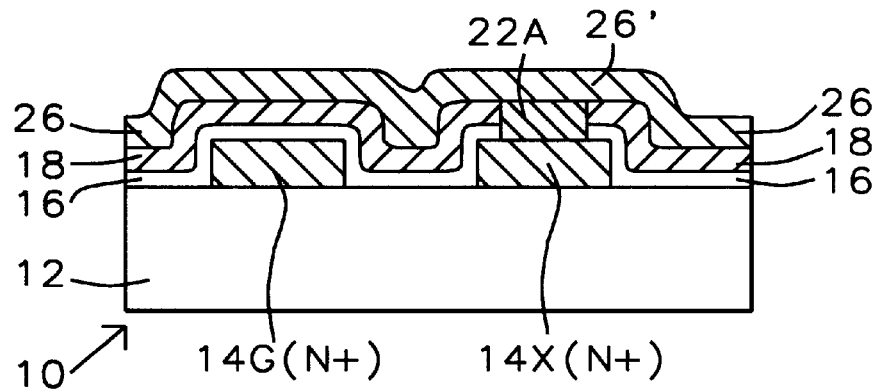
Figure 1F:
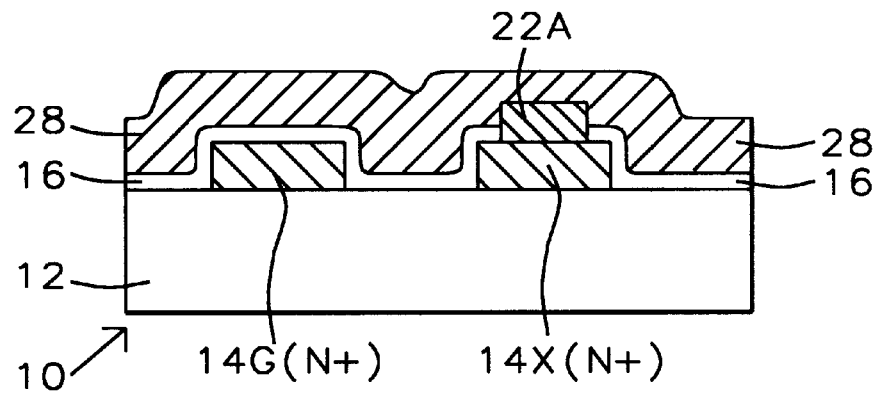
Figure 1G:
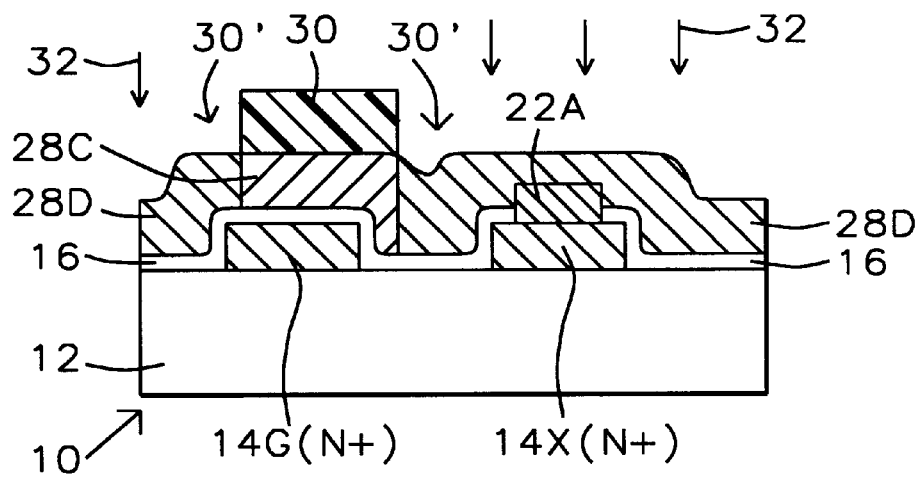

In accordance with a first embodiment of this invention the process flow is shown in FIGS. 1A–1G which are cross sections of a device in the course of manufacture and is described in connection with FIGS. 2A–2B which are flow charts describing the process flow of making the device shown in FIG. 1G.

In general, a split amorphous silicon ($\alpha$-Si) layer 18 is deposited on the gate oxide layer 16 to avoid the covering of photoresist layer 24 directly on gate oxide layer 16 and so that the quality of the interface between the gate oxide layer 16 and the polysilicon channel 28 is improved. In addition, a cap silicon oxide (buffer) layer 20 is deposited over the surface of the split amorphous silicon ($\alpha$-Si) layer 18 in order to prepare to let tungsten grow selectively on the polysilicon interconnect 14X which is to be the bottom of the contact.

Figure 2A:
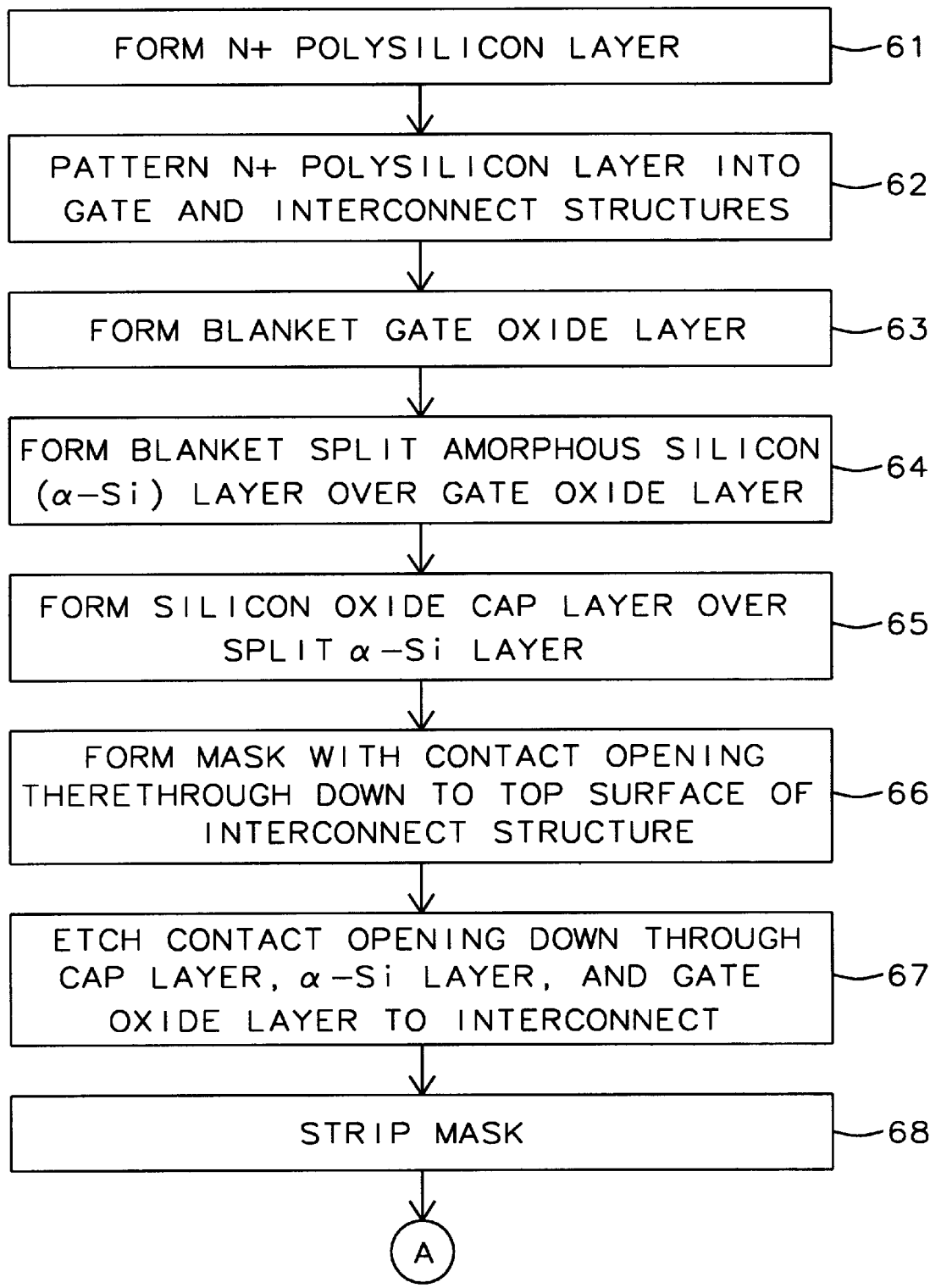
FIGS. 2A–2B are flow charts describing the process flow shown in FIGS. 1A–1G, for making the device of FIG. 1G.

Referring to FIGS. 1A and 2A the results of the first few steps of the process of manufacture of a device 10 in accordance with this invention are shown, and described starting with block 61 of FIG. 2A. In an early stage of manufacture, device 10 starts with a substrate 12 composed of interpolysilicon oxide formed by an O$_3$ TEOS by (SACVD) process. Next on substrate 12, an N+ doped polysilicon layer 14 is formed. Layer 14 has a thickness from about 500 Å to about 1,000 Å.

The next step of the process was to pattern N+ doped polysilicon layer 14 into structures comprising doped polysilicon bottom gate electrode 14G and doped polysilicon interconnect 14X on the surface of substrate 12, as described in block 62 of FIG. 2A.

Then a blanket gate oxide layer 16 with a thickness from about 200 Å to about 500 Å is formed over bottom gate electrode 14G, interconnect 14X and exposed surfaces of substrate 12, as described in block 63.

Subsequently, a blanket split amorphous silicon ($\alpha$-Si) layer 18 with a thickness from about 100 Å to about 600 Å was formed over gate oxide layer 16, as described in block 64. The layer 16 is split in the sense that there will be a complementary amorphous silicon ($\alpha$-Si) layer 26 to be added later. The $\alpha$-Si layer 18 is formed by the process of LPCVD.

Next, a silicon oxide cap (buffer oxide) layer 20 with a thickness from about 300 Å to about 500 Å is formed by the process of CVD silicon oxide (PECVD silicon oxide, SA silicon oxide, etc.) over split $\alpha$-Si layer 18, as described in block 65.

The next step in the process was to form a photoresist mask 24 with contact opening 24' therethrough down to the top surface of interconnect structure 14X, as described in block 66.

Next, referring to FIGS. 1B and 2A, a contact opening 20' was etched down through contact opening 24' through photoresist mask 24 through cap layer 20, $\alpha$-Si layer 18, and gate oxide layer 16 to the upper surface of doped polysilicon interconnect 14X, as described in block 67 of FIG. 2A.

Then mask 24 was stripped from device 10, as described in block 68 in FIG. 2A.

Figure 2B:
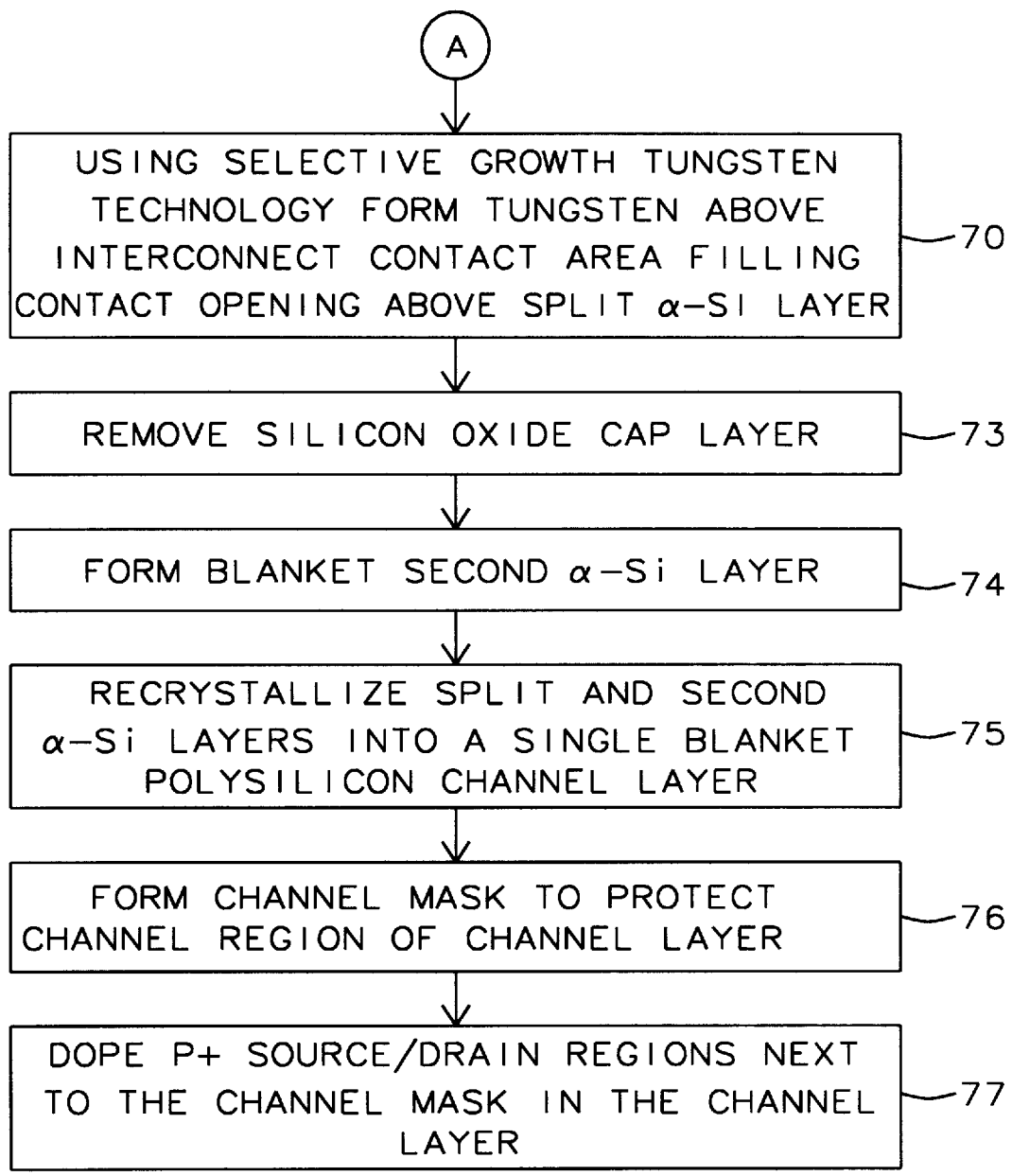

Referring to FIGS. 1C and 2B, a conductive metal contact region 22, preferably composed of tungsten, is formed on the top surface of interconnect structure 14X in the interconnect contact area filling contact opening 20' above split $\alpha$-Si layer, as described in block 70 in FIG. 2B. In general, region 22 can be composed of a metal selected from the group of refractory metals comprising tungsten, molybdenum, and titanium.

A tungsten metal contact 22 can be deposited selectively as a tungsten layer by a CVD (Chemical Vapor Deposition) process to form a direct contact to the polysilicon layer 28D (S/D region) to be formed later as seen in FIG. 1G.

Preferred Embodiment

Using SiH$_4$ reduction of WF$_6$ with the following reaction

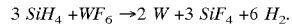

the advantages are as follows:
1. Minimal erosion of Si and minimal encroachment of Si contact.
2. Formation of tungsten (W) films with smoother surfaces.

Remove silicon oxide (buffer oxide) cap layer 20, as shown in FIG. 1D and as described in block 73 in FIG. 2B by the process of dry/wet etching for the case of a tungsten metal contact 22. (Note that a dry etching process is employed for the titanium silicide case described below in connection with FIGS. 3A–3I below.) It is noted that tungsten contact region 22 is reduced in thickness to form a thinner tungsten contact region 22A which forms an ohmic stack contact.

Referring to FIG. 2B and FIG. 1E, the device 10 has been coated with a blanket second $\alpha$-Si layer 26 with a thickness from about 100 Å to about 600 Å, as described in block 74. The $\alpha$-Si layer 26 is formed by the process of LPCVD.

Next, referring to FIG. 1F and as described in block 75 in FIG. 2B the device is heated to a temperature from about 550° C. to about 650° C. for a time from about twenty-four (24) hours to about one-hundred twenty (120) hours by the process of annealing in N$_2$ (nitrogen gas) to recrystallize the combination of two layers, i.e. the split $\alpha$-Si layer 18 and the second $\alpha$-Si layer 26, into a single blanket polysilicon channel layer 28, as described in block 75. Maybe (at least at the interfaces) WSi$_x$ is formed, but it is not a critical problem.

Next, referring to FIG. 1G and as described in block 76 in FIG. 2B, a channel mask 30 has been formed on layer 28 above bottom gate electrode 14G to protect a channel region 28C to be formed in channel layer 28 beneath the mask 30, as described in block 76. Channel mask 30 includes openings 30' on either side of the channel region 28C.

Next, P+ source/drain regions 28D are doped with dopant ions 32 implanted where openings 30' exist next to the channel mask 30 in the channel layer, as described in block 77.

After annealing the concentration of boron, P+ type dopant in the source/drain regions 28D was from about 1 E 18 atoms/cm$^3$ to about 1 E 20 atoms/cm$^3$. The doped source/drain regions 28D were formed by being ion implanted with a dose of boron (P type) dopant ions 32 from about 1 E 15 ions/cm$^2$ to about 1 E 16 ions/cm$^2$ at an energy from about 30 keV to about 60 keV.

Second Embodiment

Figure 3A:
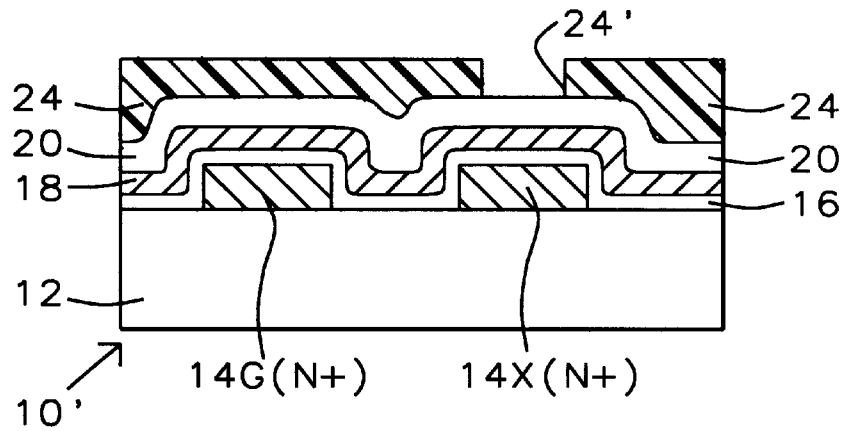
FIGS. 3A–3I which are cross sections of another device in accordance with this invention showing the process flow in the course of manufacture thereof.
Figure 3B:
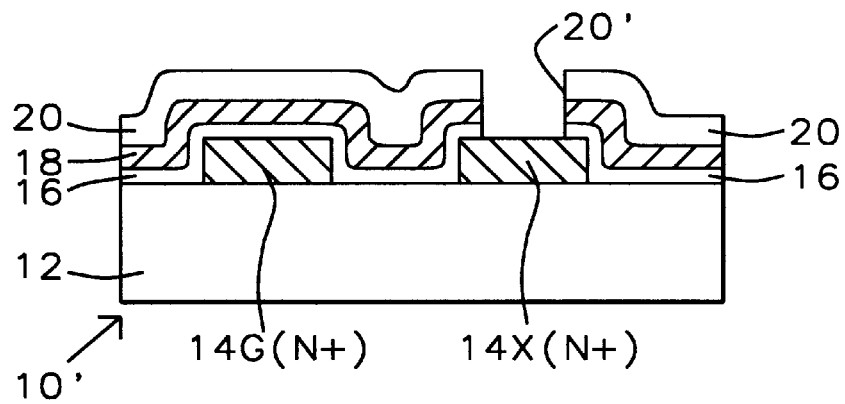
Figure 3C:
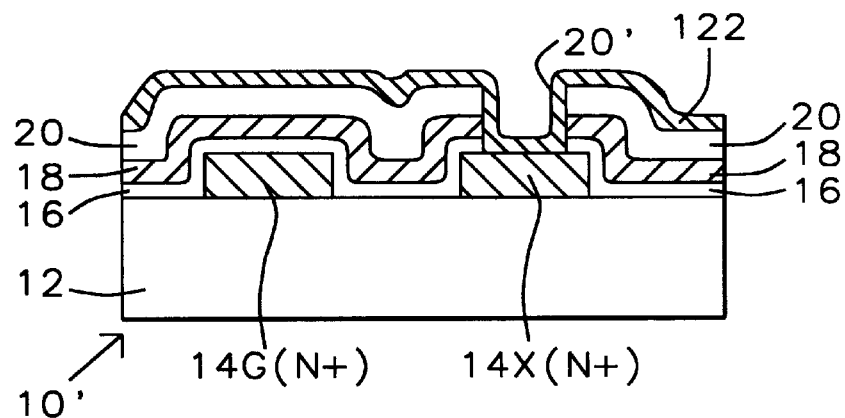
Figure 3D:
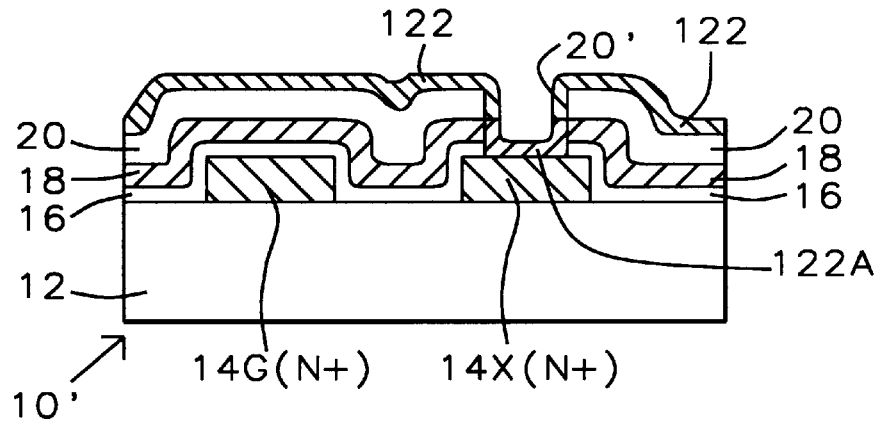
Figure 3E:
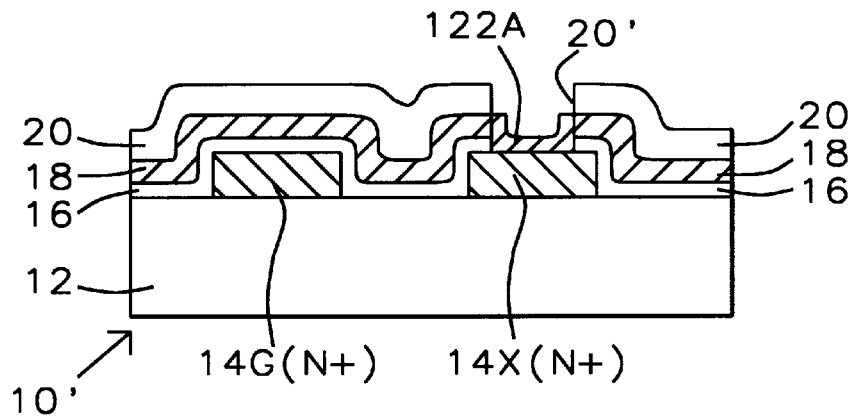
Figure 3F:
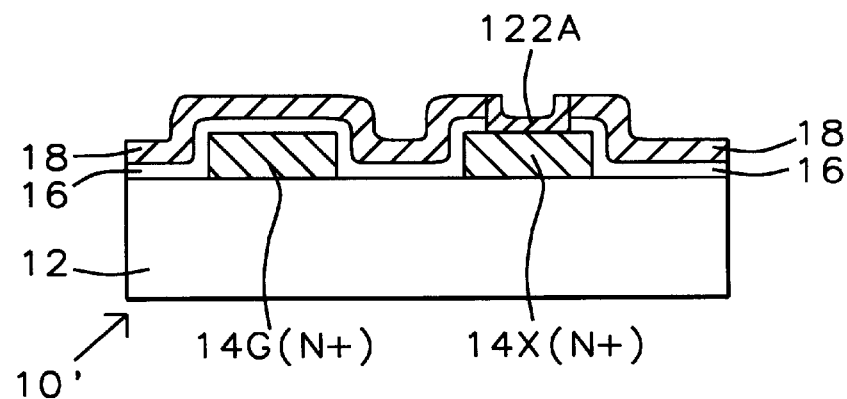
Figure 3G:
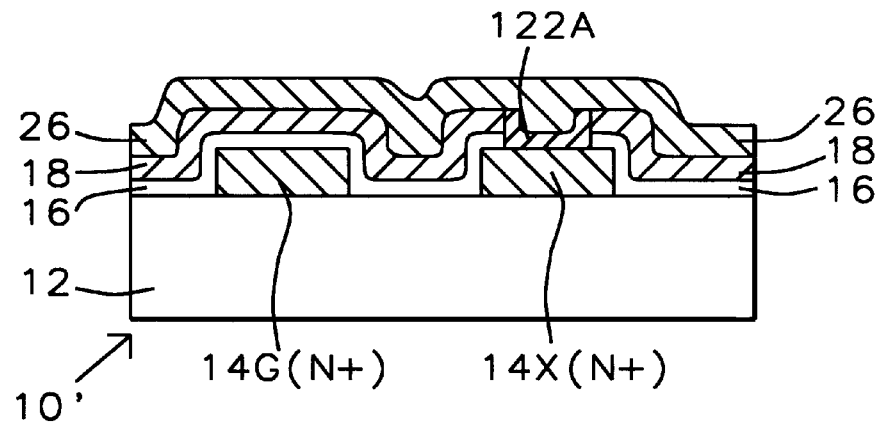
Figure 3H:
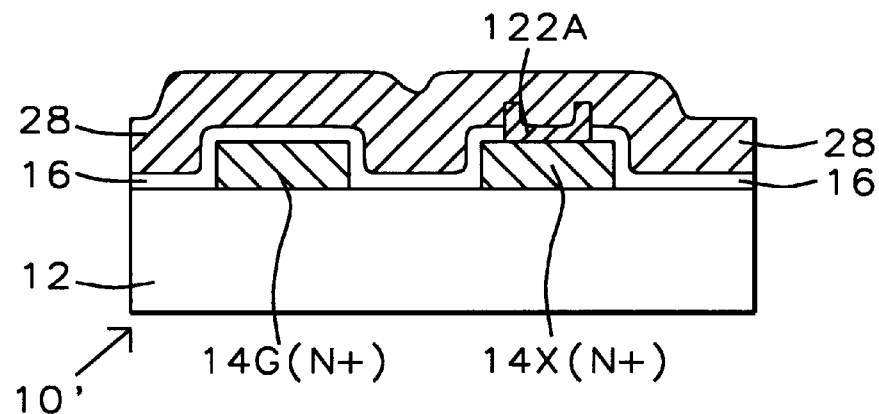
Figure 3I:
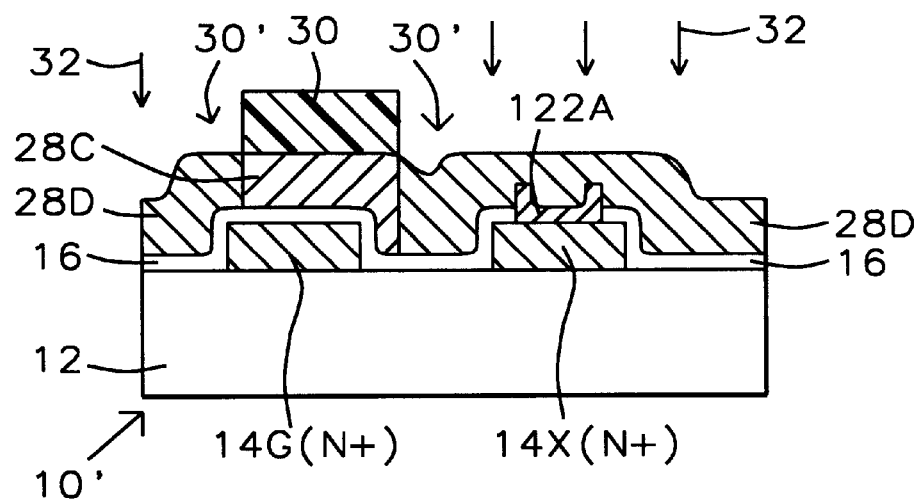

In accordance with a second embodiment of this invention the process flow is shown in FIGS. 3A–3I which show cross sections of a device 10' in the course of manufacture which is described in connection with FIGS. 4A–4B which are flow charts describing the process flow for manufacturing the device of FIG. 3I.

Referring to FIG. 3A, a device 10' in accordance with this invention is shown in an early stage of manufacture which is the same as in FIG. 1A. The process of FIGS. 3A–3H and FIGS. 4A and 4B is very similar to that of FIGS. 1A–1G and FIGS. 2A and 2B so the description here will focus on the differences between the two process sequences. Otherwise the process steps are the same and like reference numbers are employed for like parts.

Figure 4A:
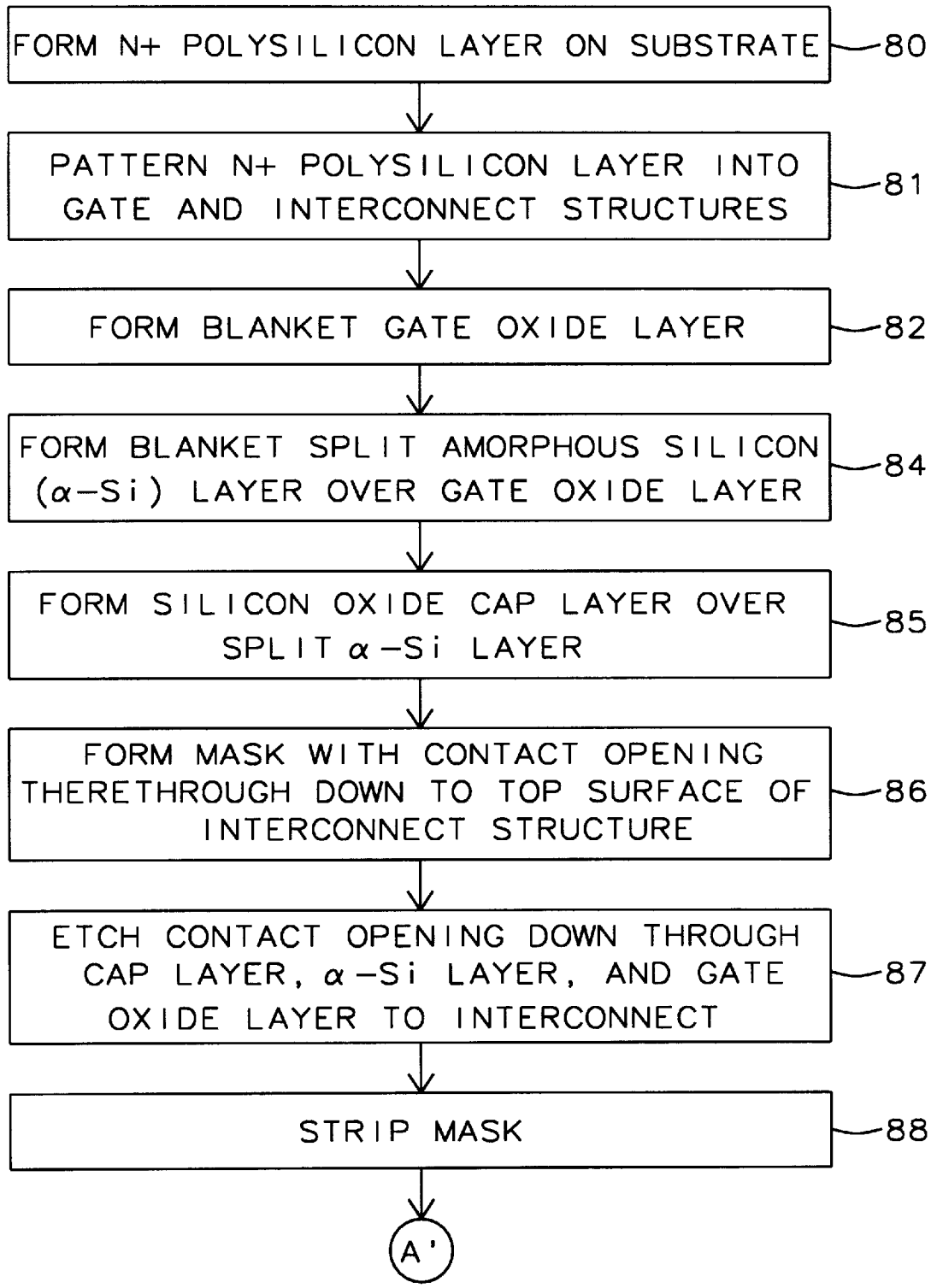
FIGS. 4A–4B are flow charts describing the process flow shown in FIGS. 3A–3I, for making the device of FIG. 3I.

Referring to FIGS. 3A and 4A, the first step of the process of manufacture of device 10' is formation of an N+ doped polysilicon layer 14 on silicon oxide substrate 12, as described in block 80.

The next process step was is to pattern N+ polysilicon layer 14 into structures comprising polysilicon bottom gate electrode 14G and polysilicon interconnect 14X, as described in block 81 by masking and etching as will be understood by those skilled in the art.

Then a blanket gate oxide layer 16 is formed over bottom gate electrode 14G, interconnect 14X and exposed surfaces of substrate 12, as described in block 82.

Subsequently, a blanket split amorphous silicon (α-Si) layer 18 is formed over gate oxide layer 16, as described in block 84.

Next, a silicon oxide cap (buffer oxide) layer 20 is formed over split α-Si layer 18, as described in block 85.

The next step in the process is to form a photoresist mask 24 with contact opening 24' therethrough down to the top surface of interconnect structure 14X, as described in block 86.

Next, referring to FIG. 3B and step 87 in FIG. 4A, a contact opening 20' is etched down through contact opening 24' through photoresist mask 24 through cap layer 20, α-Si layer 18, and gate oxide layer 16 to the upper surface of interconnect 14X, as described in block 87.

Then as shown in FIG. 3B, after etching of contact opening 20', the mask 24 was stripped from device 10', as described in block 88 in FIG. 4A. Contact opening 20' exposes walls of the first α-Si layer 18.

Figure 4B:
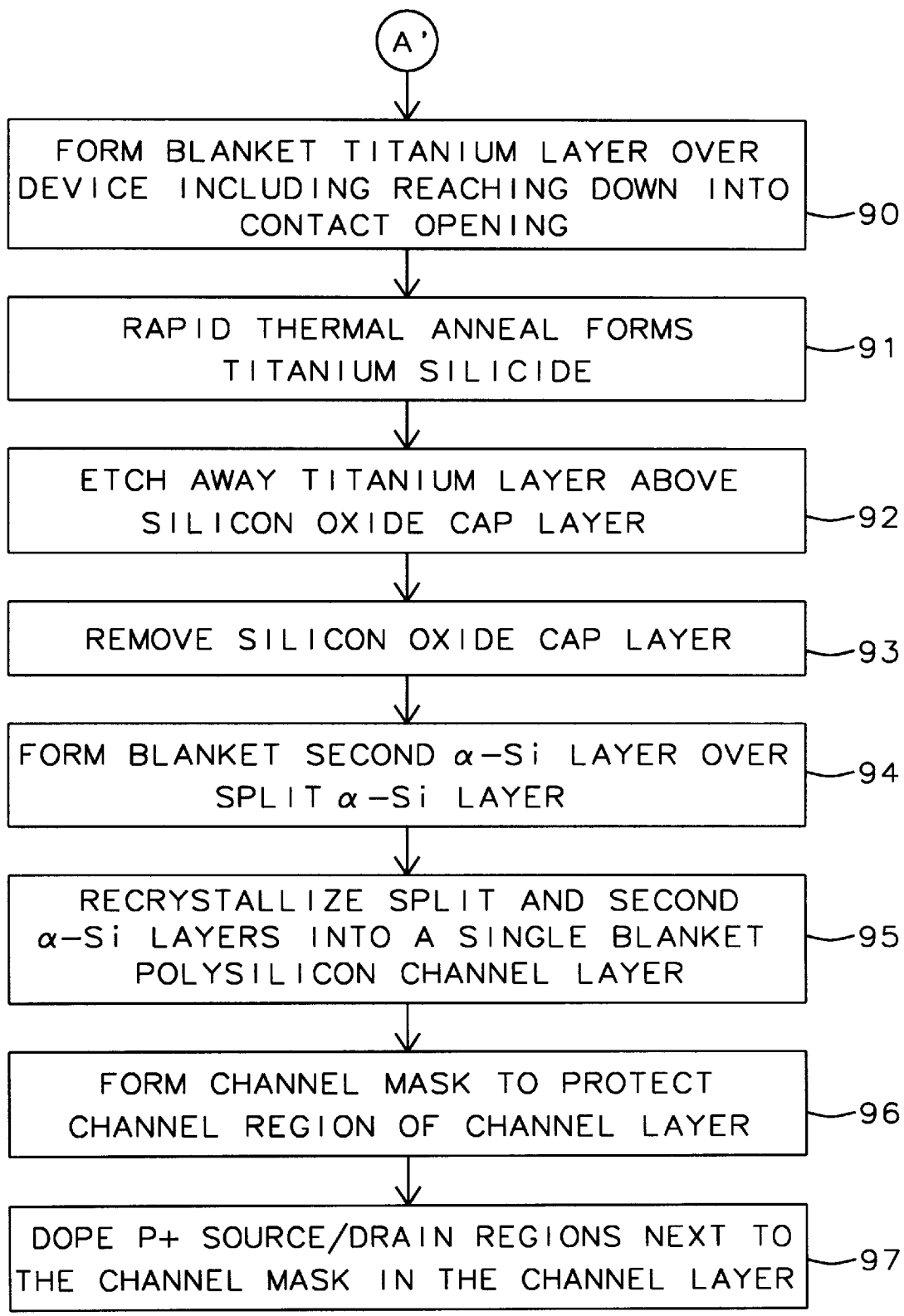

Referring to FIG. 3C and block 90 in FIG. 4B, a blanket titanium contact layer 122 was formed over device 10' reaching down into contact opening 20', composed of titanium. The titanium contact layer 122 is formed on the top surface of device 10' by the process of sputtered deposition at from about 250° C. to about 450° C.

The next step in block 91 in FIG. 4B, as shown in FIG. 3D, is to perform a rapid thermal anneal by heating device 10' to a temperature from about 750° C. to about 850° C. for a time from about 30 seconds to about 60 seconds, yielding titanium silicide layer 122A (in a salicide process at the base of contact opening 20') only where the titanium layer 122 comes into contact with silicon. In particular, the only part of the titanium layer 122 which is converted to titanium silicide 122A are the portions of titanium layer 122 in contact with the polysilicon interconnect contact layer 14X or the α-Si layer 18. The remainder of layer 122 remains titanium because it is isolated from sources of silicon.

Then the next step described in block 92 in FIG. 4B, as shown in FIG. 3E, was to (selectively) etch away the remaining titanium layer 122 above silicon oxide cap layer 20 and above titanium silicide 122A so that the titanium silicide region 122A remains at the base of interconnect contact opening 20', above polysilicon interconnect contact layer 14X but the unconverted remainder of the titanium layer 122 is removed. The titanium silicide 122A which remains in FIGS. 3E–3I connects the top surface of interconnect 14X and the walls of the first α-Si layer 18 formed by contact opening 20' as seen in FIG. 3E.

The next step 93 in FIG. 4B was to remove silicon oxide (buffer oxide) cap layer 20, as shown in FIG. 3F, by the process of dry reactive ion etching process. Thus silicon oxide cap 20 is removed in a dry etching process.

Referring to step 94 in FIG. 4B and as shown in FIG. 3G, the device 10' is coated with a blanket second α-Si layer 26 with a thickness from about 100 Å to about 600 Å, as described in block 94. The α-Si layer 26 is formed by the process of LPCVD.

Next, referring to FIG. 3H and as described in block 95 in FIG. 4B, in a recrystallization step, the device 10' has been heated to a temperature from about 550° C. to about 650° C. for a duration from about twenty-four (24) hours to about one-hundred-twenty (120) hours by the process of annealing in an ambient atmosphere of nitrogen ($N_2$) gas to recrystallize both split α-Si layer 18 and second α-Si layer 26 into a single blanket polysilicon channel layer 28, as described in block 95.

Next, referring to FIG. 3I and as described in block 96 in FIG. 4B a channel mask 30 has been formed on layer 28 above bottom gate electrode 14G to protect a channel region 28C to be formed in channel layer 28 beneath the mask 30. Mask 30 includes openings 30' on either side of the channel region 28C.

Next, referring again to FIG. 3I and as described in block 97 in FIG. 4B P+ source/drain regions 28D are being doped with ions 32 next to the channel mask in the channel layer, as described in block 97.

After annealing the concentration of boron, P+ type dopant in the source/drain regions 28D was from about 1 E 18 atoms/cm$^3$ to about 1 E 20 atoms/cm$^3$. The source/drain regions 28D were formed by being ion implanted with a dose of boron (P type) dopant ions 32 from about 1 E 15 ions/cm$^2$ to about 1 E 16 ions/cm$^2$ at an energy from about 30 keV to about 60 keV.

Two requirements of a high performance TFT transistor are (1) high $I_{ON}/I_{OFF}$ ratio and (2) a low subthreshold swing.

With respect to a high $I_{ON}/I_{OFF}$ ratio, two factors are as follows:

1) A large $I_{ON}$ (reduces the series resistance and voltage drop across the contact as the operating voltages decreases);

2) A small $I_{OFF}$ (low interface state density is necessary). For a low $I_{OFF}$ device, a low interface state density is necessary.

With respect to a low subthreshold swing three factors are as follows:

1) Low interface state density;

2) Reduce the voltage drop across contact;

3) Reduce the series resistance.

Without this invention an alternative would be to place photoresist on the gate oxide directly which has the disadvantages as follows:

1) $D_{it}$ is up;

2) $I_{OFF}$ is up; and

3) Subthreshold swing is up.

In the case that a PN junction diode exists at the polysilicon-interconnect contact, the disadvantages are as follows:

1) Higher voltage drop across the contact;

2) $I_{ON}$ falls;

3) Worse subthreshold swing.

With this invention the photoresist is prevented from being placed on the gate oxide directly which has the advantages as follows:

1) Lower interface state density;

2) $I_{OFF}$ is down; and

3) Better subthreshold swing; and

4) Long term reliability is improved.

Avoiding the formation of the PN junction diode at the polysilicon-interconnect contact has the advantages as follows:

1) Series resistance falls;

2) $I_{ON}$ rises

3) Lower voltage drop across the contact(Voltage drop falls)

4) Subthreshold swing falls, i.e. better subthreshold swing.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a contact in a thin film transistor with a gate electrode and an interconnect formed on a substrate, in an SRAM device comprising the steps as follows:

forming an interconnect and a gate electrode on said substrate said interconnect having a top surface, form a gate oxide layer covering exposed surfaces of said interconnect, said gate electrode and said substrate, forming a first amorphous silicon layer over said gate oxide layer, forming a cap layer over said amorphous silicon layer, forming a contact opening through said cap layer, said first amorphous silicon layer, and said gate oxide layer down to said top surface of said interconnect, said contact opening exposing as follows:
a) walls of said cap layer,
b) walls of said gate oxide layer, and
c) walls of said amorphous silicon layer, selectively forming a contact metal structure filling said contact opening and in contact with said top surface of said interconnect, and said contact metallization being in contact with said walls of said gate oxide layer, said walls of said first amorphous silicon layer and said walls of said cap layer, removing said cap layer from said first amorphous silicon layer in a subtractive process, forming a second amorphous silicon layer on said exposed surfaces of said first amorphous silicon layer and on exposed surfaces of said contact metal structure, recrystallizing said first and said second amorphous silicon layers to form a polysilicon channel layer from said first amorphous silicon layer and said second amorphous silicon layer, and doping regions of said polysilicon channel layer aside from a channel region above said gate electrode.

2. A method in accordance with claim 1 wherein before removing said cap layer from said first amorphous silicon layer, selectively forming said contact metallization in said contact opening on said top surface of said interconnect as a contact layer.

3. A method in accordance with claim 1 wherein:

before removing said cap layer from said first amorphous silicon layer, selectively forming said contact metallization in said contact opening on said top surface of said interconnect as a contact layer by reacting silane and tungsten hexafluoride to form tungsten in said contact opening on said surface of said interconnect, and then removing said cap layer from said device.

4. A method in accordance with claim 1 wherein:

before removing said cap layer from said first amorphous silicon layer, selectively forming said contact metallization in said contact opening on said top surface of said interconnect as a contact layer by reacting silane and tungsten hexafluoride to form tungsten in said contact opening on said surface of said interconnect in contact with said first amorphous silicon layer, then removing said cap layer from said device, and then after said recrystallizing step forming a channel mask to protect a channel region over said channel layer, and doping said channel layer in source/drain regions through openings in said channel mask.

5. A method in accordance with claim 1 wherein:

said first amorphous silicon layer comprises an LPCVD silicon oxide from about 100 Å to about 600 Å thick, said cap layer comprises a CVD silicon oxide from about 300 Å to about 500 Å thick, before removing said cap layer from said first amorphous silicon layer said contact metallization is formed selectively in said contact opening on the surface of said interconnect as a contact layer, and said second amorphous silicon layer comprises an LPCVD amorphous silicon from about 100 Å to about 600 Å thick.

6. A method in accordance with claim 1 wherein:

said first amorphous silicon layer comprises an LPCVD amorphous silicon from about 100 Å to about 600 Å thick, said cap layer comprises a CVD silicon oxide from about 300 Å to about 500 Å thick, before removing said cap layer from said first amorphous silicon layer, said contact metallization is formed selectively in said contact opening on said top surface of said interconnect as a contact layer by reacting silane and tungsten hexafluoride to form tungsten in said contact opening on said surface of said interconnect, and then removing said cap layer from said device, and said second amorphous silicon layer comprises an LPCVD amorphous silicon from about 100 Å to about 600 Å thick.

7. A method in accordance with claim 1 wherein:

said first amorphous silicon layer comprises an LPCVD amorphous silicon from about 100 Å to about 600 Å thick, said cap layer comprises a CVD silicon oxide from about 300 Å to about 500 Å thick, before removing said cap layer from said first amorphous silicon layer, selectively forming said contact metallization in said contact opening on said surface of said interconnect as a contact layer by reacting silane and tungsten hexafluoride to form tungsten on said surface of said interconnect, then removing said cap layer from said device, said second amorphous silicon layer comprises an LPCVD amorphous silicon from about 100 Å to about 600 Å thick, then performing said recrystallizing step at a temperature from about 550° C. to about 650° C. in an ambient atmosphere of nitrogen gas for from about 24 hours to about 120 hours, then after said recrystallizing step forming a channel mask to protect a channel region over said channel layer, and doping said channel layer in source/drain regions through openings in said channel mask.

8. A method of forming a contact in a thin film transistor with a gate electrode and a polysilicon interconnect formed on a substrate, in an SRAM device comprising the steps as follows:

forming a gate oxide layer over said exposed surfaces of said substrate, said gate electrode and said polysilicon interconnect, forming a first amorphous silicon layer over said gate oxide layer, forming a cap layer over said first amorphous silicon layer, forming a contact opening through said cap layer, said first amorphous silicon layer, and said gate oxide layer down to said top surface of said interconnect, said contact opening exposing as follows:
 a) walls of said cap layer,
 b) walls of said gate oxide layer, and
 c) walls of said amorphous silicon layer, forming a blanket contact metal layer on said cap layer and reaching down into said opening and onto said top surface of said interconnect and in contact with said walls of first amorphous silicon layer in said contact opening, then performing a rapid thermal anneal to react said metal layer with silicon in said amorphous silicon layer and said interconnect to form a metal silicide layer selectively in said opening on the surface of said interconnect as a contact layer connecting between said interconnect and said first amorphous silicon layer leaving the remainder of said contact metallization unreacted, removing said cap layer from said device by a subtractive process, forming a second amorphous silicon layer on said first silicon layer, recrystallizing said first and said second amorphous silicon layers to form a polysilicon channel layer from said amorphous silicon layers, and doping regions of said polysilicon channel layer aside from a channel region above said gate electrode.

9. A method in accordance with claim 8 wherein said blanket layer of contact metallization comprises a layer of titanium.

10. A method in accordance with claim 8 including:

before removing said cap layer from said device forming a blanket layer of titanium contact metallization on the surface of said device and in said opening on the surface of said interconnect as a contact layer, and selectively performing a rapid thermal anneal to form titanium silicide on the surface of said interconnect by reaction with said contact layer and said first amorphous silicon layer while leaving said titanium intact away from said interconnect.

11. A method in accordance with claim 8 including the steps comprising:

said step of forming said blanket contact metallization comprises forming a titanium layer, selectively performing said rapid thermal anneal to form titanium silicide on the surface of said interconnect by reaction with said titanium layer and said first amorphous silicon layer while leaving said titanium unreacted and intact away from said interconnect, then performing said etch of said remainder of said contact metallization which comprises unreacted titanium from the surface of said cap layer, then removing said cap layer from said device by dry reactive ion etching, and then forming said second amorphous silicon layer, then performing said recrystallizing step, then after performing said recrystallizing step forming a channel mask to protect a channel region over said channel layer, and doping said channel layer in source/drain regions through openings in said channel mask.

12. A method in accordance with claim 11 wherein:

said first amorphous silicon layer comprises an LPCVD amorphous silicon from about 100 Å to about 600 Å thick, said cap layer comprises a CVD silicon oxide from about 300 Å to about 500 Å thick, and said second amorphous silicon layer comprises an LPCVD amorphous silicon from about 100 Å to about 600 Å thick.

13. A method in accordance with claim 11 wherein:

said first amorphous silicon layer comprises an LPCVD silicon oxide from about 100 Å to about 600 Å thick, said cap layer comprises a CVD silicon oxide from about 300 Å to about 500 Å thick, said second amorphous silicon layer comprises an LPCVD amorphous silicon from about 100 Å to about 600 Å thick, and then performing said recrystallizing step at a temperature from about 550° C. to about 650° C. in an ambient atmosphere of nitrogen gas for from about 24 hours to about 120 hours.

14. A method of forming a contact in a thin film transistor with a gate electrode and an interconnect formed on a substrate, in an SRAM device comprising the steps as follows:

forming a gate oxide layer over exposed surfaces of said substrate, said gate electrode and said interconnect, forming a first amorphous silicon layer over said gate oxide layer, forming a cap layer over said first amorphous silicon layer, forming a contact opening through said cap layer, said first amorphous silicon layer exposing walls of said first amorphous silicon layer, and walls of said gate oxide layer down to a region of said top surface of said interconnect, said contact opening exposing as follows:

a) walls of said cap layer,
b) walls of said gate oxide layer, and
c) walls of said amorphous silicon layer, forming contact metallization connecting between said interconnect and said first amorphous silicon layer with said contact metallization reaching down into said opening and covering said region of said top surface of said interconnect and covering said walls of said first amorphous silicon layer and walls of said gate oxide layer in said contact opening, removing said cap layer from said device by a subtractive process, forming a second amorphous silicon layer on exposed surfaces of said first silicon layer and said contact metallization, recrystallizing said first and said second amorphous silicon layers to form a polysilicon channel layer from said amorphous silicon layers, and doping regions of said polysilicon channel layer aside from a channel region above said gate electrode.

15. A method in accordance with claim 14 wherein:

said contact metallization is formed as a blanket contact layer over said device, followed by rapid thermal annealing causing formation of metal silicides over silicon containing surfaces of said interconnect and said first amorphous silicon layer, and then etching away remaining metallization which has not been converted to a metal silicide, with said metallization which has been converted to a metal silicide to rapid thermal annealing remaining in said opening.

16. The method of claim 14 wherein steps of forming said contact metallization between said interconnect and said first amorphous silicon layer are performed as follows:

forming a contact metal connecting said first amorphous silicon layer and said interconnect, said said contact metal filling said opening in said cap layer and forming contact as follows:
a) with said region of said top surface of said interconnect and
b) with said walls of said first amorphous silicon layer, and removing said cap layer from said first amorphous silicon layer in a subtractive process.

17. The method of claim 14 wherein steps of forming contact metallization between said interconnect and said amorphous silicon layer are performed as follows:

forming a blanket layer of a contact metal in said opening and on said top surface of said interconnect, on said walls of said first amorphous layer forming contact between said first amorphous silicon layer and said interconnect, then performing a rapid thermal anneal to form a metal silicide layer selectively in said opening on the surface of said interconnect as a contact layer leaving the remainder of said contact metallization unreacted, then removing said cap layer from said first amorphous silicon layer in a subtractive process.

18. A method in accordance with claim 17 wherein:

after forming said contact opening then forming a blanket layer of said contact metallization over said cap layer, before removing said cap layer from said first amorphous silicon layer selectively performing rapid thermal annealing to form a metal silicide layer in said opening on the surface of said interconnect as a contact layer.

19. A method in accordance with claim 18 wherein said blanket layer of contact metallization comprises a layer of titanium.

20. A method in accordance with claim 18 wherein:

before removing said cap layer from said device, forming a blanket layer of titanium contact metallization on the surface of said device and in said opening on the surface of said interconnect as a contact layer, selectively performing a rapid thermal anneal to form titanium silicide on the surface of said interconnect by reaction with said contact layer and said first amorphous silicon layer while leaving said titanium intact away from said interconnect.

21. A method in accordance with claim 18 wherein:

before removing said cap layer from said first amorphous silicon layer, forming said contact metallization on said cap layer and in said opening on the surface of said interconnect, performing a rapid thermal anneal to form titanium silicide selectively on the surface of said interconnect by reaction with said contact layer and said first amorphous silicon layer while leaving said titanium unreacted and intact away from said interconnect, then removing said unreacted titanium from the surface of said cap layer, then removing said cap layer from said device, then forming said second amorphous silicon layer, then after performing said recrystallizing step forming a channel mask to protect a channel region over said channel layer, and doping said channel layer in source/drain regions through openings in said channel mask.

22. A method in accordance with claim 17 wherein:

before removing said cap layer from said first amorphous silicon layer, forming said contact metallization as a blanket contact layer on said first amorphous silicon layer and in said opening on the surface of said interconnect as a contact layer by depositing a blanket layer of titanium on said cap layer and into said opening followed by rapid thermal annealing to form titanium silicide on said surface of said interconnect where said titanium is in contact with said first amorphous silicon layer while leaving said titanium unreacted and intact away from said interconnect, and then etching away the unreacted remainder of said titanium, then removing said cap layer from said device, and then after said recrystallizing step forming a channel mask to protect a channel region over said channel layer, and doping said channel layer in source/drain regions through openings in said channel mask.

23. A method in accordance with claim 17 including:

said metal being titanium, performing said rapid thermal annealing at a temperature from about 750° C. to about 850° C. to form titanium silicide, and then etching away the unreacted remainder of said titanium with said titanium silicide remaining in said opening.

* * * * *